United States Patent
Yang et al.

(10) Patent No.: US 10,192,751 B2
(45) Date of Patent: Jan. 29, 2019

(54) SYSTEMS AND METHODS FOR ULTRAHIGH SELECTIVE NITRIDE ETCH

(71) Applicant: Lam Research Corporation, Fremont, CA (US)

(72) Inventors: Dengliang Yang, Union City, CA (US); Faisal Yaqoob, Fremont, CA (US); Pilyeon Park, Santa Clara, CA (US); Helen H. Zhu, Fremont, CA (US); Joon Hong Park, Dublin, CA (US)

(73) Assignee: LAM RESEARCH CORPORATION, Fremont, CA (US)

( * ) Notice: Subject to any disclaimer, the term of this patent is extended or adjusted under 35 U.S.C. 154(b) by 0 days.

(21) Appl. No.: 15/271,381

(22) Filed: Sep. 21, 2016

(65) Prior Publication Data

US 2017/0110335 A1    Apr. 20, 2017

Related U.S. Application Data

(60) Provisional application No. 62/241,827, filed on Oct. 15, 2015.

(51) Int. Cl.
*H01L 21/311* (2006.01)
*H01J 37/32* (2006.01)

(52) U.S. Cl.
CPC ...... *H01L 21/31116* (2013.01); *H01J 37/321* (2013.01); *H01J 2237/334* (2013.01)

(58) Field of Classification Search
USPC ........................................... 216/68; 438/724
See application file for complete search history.

(56) References Cited

U.S. PATENT DOCUMENTS 4,374,698 A    2/1983 Sanders et al.
4,431,477 A    2/1984 Zajac
(Continued)

FOREIGN PATENT DOCUMENTS

EP    0424299 A2    4/1991
EP    0424299 A3    8/1991
(Continued)

OTHER PUBLICATIONS

U.S. Appl. No. 15/399,692, Treadwell et al.
(Continued)

*Primary Examiner* — Roberts P Culbert

(57) ABSTRACT

A method for selectively etching a silicon nitride layer on a substrate includes arranging a substrate on a substrate support of a substrate processing chamber. The substrate processing chamber includes an upper chamber region, an inductive coil arranged outside of the upper chamber region, a lower chamber region including the substrate support and a gas dispersion device. The gas dispersion device includes a plurality of holes in fluid communication with the upper chamber region and the lower chamber region. The method includes supplying an etch gas mixture to the upper chamber region and striking inductively coupled plasma in the upper chamber region by supplying power to the inductive coil. The etch gas mixture etches silicon nitride, promotes silicon dioxide passivation and promotes polysilicon passivation. The method includes selectively etching the silicon nitride layer on the substrate and extinguishing the inductively coupled plasma after a predetermined period.

28 Claims, 7 Drawing Sheets

(56) References Cited

U.S. PATENT DOCUMENTS

| | | | |
|---|---|---|---|
| 4,793,897 A | 12/1988 | Dunfield et al. | |
| 5,329,965 A | 7/1994 | Gordon | |
| 5,605,179 A | 2/1997 | Strong, Jr. et al. | |
| 5,662,143 A | 9/1997 | Caughran | |
| 5,744,695 A | 4/1998 | Forbes | |
| 6,042,687 A | 3/2000 | Singh et al. | |
| 6,060,400 A | 5/2000 | Oehrlein et al. | |
| 6,074,959 A | 6/2000 | Wang et al. | |
| 6,152,168 A | 11/2000 | Ohmi et al. | |
| 6,376,386 B1 | 4/2002 | Oshima | |
| 6,841,943 B2 | 1/2005 | Vahedi et al. | |
| 6,962,879 B2 | 11/2005 | Zhu et al. | |
| 7,129,171 B2 | 10/2006 | Zhu et al. | |
| 7,288,482 B2 | 10/2007 | Panda et al. | |
| 7,309,646 B1 | 12/2007 | Heo et al. | |
| 7,338,907 B2 | 3/2008 | Li et al. | |
| 7,757,541 B1 | 7/2010 | Monkowski et al. | |
| 7,758,698 B2 | 7/2010 | Bang et al. | |
| 8,137,463 B2 | 3/2012 | Liu et al. | |
| 8,552,334 B2 | 10/2013 | Tappan et al. | |
| 8,555,920 B2 | 10/2013 | Hirata et al. | |
| 8,592,328 B2 | 11/2013 | Hausmann et al. | |
| 8,889,024 B2 | 11/2014 | Watanabe et al. | |
| 8,956,980 B1 | 2/2015 | Chen et al. | |
| 9,051,647 B2 | 6/2015 | Cooperberg et al. | |
| 9,059,678 B2 | 6/2015 | Long et al. | |
| 9,318,343 B2 | 4/2016 | Ranjan et al. | |
| 9,471,065 B2 | 10/2016 | Koyomogi et al. | |
| 9,640,409 B1 | 5/2017 | Yang et al. | |
| 2001/0002581 A1 | 6/2001 | Nishikawa et al. | |
| 2001/0004903 A1 | 6/2001 | Ohmi et al. | |
| 2001/0013363 A1 | 8/2001 | Kitayama et al. | |
| 2002/0038669 A1 | 4/2002 | Yamagishi et al. | |
| 2002/0042205 A1 | 4/2002 | McMillin et al. | |
| 2002/0046991 A1 | 4/2002 | Smith et al. | |
| 2002/0088542 A1* | 7/2002 | Nishikawa | H01J 37/3244 156/345.29 |
| 2002/0160125 A1 | 10/2002 | Johnson et al. | |
| 2002/0174905 A1 | 11/2002 | Latino et al. | |
| 2002/0175144 A1 | 11/2002 | Hung et al. | |
| 2003/0236592 A1 | 12/2003 | Shajii et al. | |
| 2003/0236638 A1 | 12/2003 | Shajii et al. | |
| 2003/0236643 A1 | 12/2003 | Shajii et al. | |
| 2004/0094206 A1 | 5/2004 | Ishida | |
| 2004/0112538 A1 | 6/2004 | Larson et al. | |
| 2004/0112539 A1 | 6/2004 | Larson et al. | |
| 2004/0112540 A1 | 6/2004 | Larson et al. | |
| 2004/0168719 A1 | 9/2004 | Nambu | |
| 2004/0173270 A1 | 9/2004 | Harris et al. | |
| 2005/0005994 A1 | 1/2005 | Sugiyama et al. | |
| 2005/0067021 A1 | 3/2005 | Bevers et al. | |
| 2005/0155625 A1 | 7/2005 | Jangjian et al. | |
| 2005/0199342 A1 | 9/2005 | Shajii et al. | |
| 2005/0241763 A1 | 11/2005 | Huang et al. | |
| 2006/0011237 A1 | 1/2006 | Tison et al. | |
| 2006/0097644 A1 | 5/2006 | Kono et al. | |
| 2006/0124169 A1 | 6/2006 | Mizusawa et al. | |
| 2006/0207595 A1 | 9/2006 | Ohmi et al. | |
| 2006/0237063 A1 | 10/2006 | Ding et al. | |
| 2007/0026684 A1 | 2/2007 | Parascandola et al. | |
| 2007/0066038 A1 | 3/2007 | Sadjadi et al. | |
| 2007/0158025 A1 | 7/2007 | Larson | |
| 2007/0233412 A1 | 10/2007 | Gotoh et al. | |
| 2007/0240778 A1 | 10/2007 | L'Bassi et al. | |
| 2007/0259112 A1 | 11/2007 | Ishikawa et al. | |
| 2008/0115834 A1 | 5/2008 | Geoffrion et al. | |
| 2008/0121178 A1 | 5/2008 | Bang et al. | |
| 2008/0202588 A1 | 8/2008 | Gold et al. | |
| 2008/0202609 A1 | 8/2008 | Gold et al. | |
| 2008/0202610 A1 | 8/2008 | Gold et al. | |
| 2009/0061083 A1 | 3/2009 | Chiang et al. | |
| 2009/0061640 A1 | 3/2009 | Wong et al. | |
| 2009/0061644 A1 | 3/2009 | Chiang et al. | |
| 2009/0183548 A1 | 7/2009 | Monkowski et al. | |
| 2009/0183549 A1 | 7/2009 | Monkowski et al. | |
| 2009/0221117 A1 | 9/2009 | Tan et al. | |
| 2009/0272717 A1 | 11/2009 | Pamarthy et al. | |
| 2009/0320754 A1 | 12/2009 | Oya et al. | |
| 2010/0030390 A1 | 2/2010 | Yamaguchi et al. | |
| 2010/0071438 A1 | 3/2010 | Davis et al. | |
| 2010/0145633 A1 | 6/2010 | Yasuda | |
| 2010/0178770 A1 | 7/2010 | Zin | |
| 2010/0229976 A1 | 9/2010 | Hirata et al. | |
| 2010/0269924 A1 | 10/2010 | Yasuda | |
| 2011/0019332 A1 | 1/2011 | Chistyakov | |
| 2011/0094596 A1 | 4/2011 | Sugiyarna et al. | |
| 2011/0253225 A1 | 10/2011 | Beeby et al. | |
| 2012/0031500 A1 | 2/2012 | Hirose et al. | |
| 2012/0034786 A1 | 2/2012 | Dhindsa et al. | |
| 2012/0149213 A1 | 6/2012 | Nittala et al. | |
| 2012/0152364 A1 | 6/2012 | Hashimoto et al. | |
| 2012/0174990 A1 | 7/2012 | Yasuda | |
| 2012/0190208 A1 | 7/2012 | Ozu et al. | |
| 2012/0238102 A1 | 9/2012 | Zhang et al. | |
| 2012/0238103 A1 | 9/2012 | Zhang et al. | |
| 2012/0244715 A1 | 9/2012 | Lebouitz et al. | |
| 2012/0289057 A1 | 11/2012 | DeDontney | |
| 2012/0298221 A1 | 11/2012 | Takeuchi et al. | |
| 2013/0008607 A1 | 1/2013 | Matsumoto et al. | |
| 2013/0025715 A1 | 1/2013 | Yamaguchi et al. | |
| 2013/0029494 A1 | 1/2013 | Sasaki et al. | |
| 2013/0045605 A1 | 2/2013 | Wang et al. | |
| 2013/0131300 A1 | 5/2013 | Olmscheid et al. | |
| 2013/0145816 A1 | 6/2013 | Lowe | |
| 2013/0220433 A1 | 8/2013 | Sawada et al. | |
| 2013/0270997 A1 | 10/2013 | Zhao et al. | |
| 2014/0080308 A1 | 3/2014 | Chen et al. | |
| 2014/0120737 A1 | 5/2014 | Swaminathan et al. | |
| 2014/0141621 A1 | 5/2014 | Ren et al. | |
| 2014/0182689 A1 | 7/2014 | Shareef et al. | |
| 2014/0248780 A1 | 9/2014 | Ingle et al. | |
| 2014/0262038 A1 | 9/2014 | Wang et al. | |
| 2015/0017810 A1 | 1/2015 | Guha | |
| 2015/0059859 A1 | 3/2015 | Takahashi et al. | |
| 2015/0287572 A1 | 10/2015 | Daugherty et al. | |
| 2016/0181116 A1 | 6/2016 | Berry, III et al. | |
| 2016/0215392 A1 | 7/2016 | Yudovsky et al. | |
| 2016/0247688 A1 | 8/2016 | Zhu et al. | |
| 2017/0032982 A1 | 2/2017 | Drewery et al. | |
| 2017/0069511 A1 | 3/2017 | Yang et al. | |
| 2017/0200586 A1 | 7/2017 | Treadwell et al. | |
| 2017/0236694 A1 | 8/2017 | Eason et al. | |

FOREIGN PATENT DOCUMENTS

| | | |
|---|---|---|
| EP | 0838842 A2 | 4/1998 |
| WO | WO-0040776 A1 | 7/2000 |
| WO | WO-2011051251 A1 | 5/2011 |
| WO | WO-2013123617 A1 | 8/2013 |
| WO | WO-2014068886 A1 | 5/2014 |

OTHER PUBLICATIONS

Blain (Mar./Apr. 1999) "Mechanism of nitrogen removal from silicon nitride by nitric oxide," Journal of Vacuum Science & Technology A, 17(2):665-667.

Blain et al. (Jul./Aug. 1996) "Role of nitrogen in the downstream etching of silicon nitride," Journal of Vacuum Science & Technology A, 14(4):2151-2157.

Bohr, Mark, "The New Era of Scaling in an SoC World" Intel Logic Technology Development; ISSCC; 2009; 66 Pages.

Dusa, Mircean et al., "Pitch Doubling Through Dual Patterning Lithography Challenges in Integration and Litho Budgets," Optical Microlithography XX, vol. 6520, 65200G, (2007); 10 pages.

European Extended Search Report dated May 30, 2016 issued in EP 15 199 363.1 [LAMRP146EP].

Kastenmeier et al. (Nov./Dec. 1999) "Highly selective etching of silicon nitride over silicon and silicon dioxide," J. Vac. Sci. Technol. A, American Vacuum Society , 17 (6):3179-3184.

Kastenmeier et al. (Sep./Oct. 1996) "Chemical dry etching of silicon nitride and silicon dioxide using CF4/02/N2 gas mixtures," J. Vac. Sci, Technol. A14(5):2802-2813.

(56) References Cited

OTHER PUBLICATIONS

Oehrlein et al. (1996) "Study of plasma-surface interactions: chemical dry etching and high-density plasma etching," Plasma Sources Sci. Technol. 5:193-199.
Tajima et al. (2013) "Room-Temperature Si Etching in NO/F2 Gases and the Investigation of Surface Reaction Mechanisms," The Journal of Physical Chemistry C, 117:5118-5125.
U.S. Office Action dated Oct. 5, 2015 issued in U.S. Appl. No. 14/576,020 [LAMRP146].
U.S. Final Office Action dated Feb. 26, 2016 issued in U.S. Appl. No. 14/576,020 [LAMRP146].
U.S. Office Action dated Sep. 23, 2016 issued in U.S. Appl. No. 14/576,020 [LAMRP146].
Yun et al. (2007) "Large Etch Rate Enhancement by NO-Induced Surface Chemical Reaction during Chemical Dry Etching of Silicon Oxide in F2 Remote Plasmas," Journal of the Electrochemical Society, 154(4):D267-D272.
U.S. Appl. No. 15/014,539, filed Feb. 3, 2016, Yang et al.
U.S. Appl. No. 14/945,680, filed Nov. 19, 2015, Drewery et al.
U.S. Appl. No. 15/399,692, filed Jan. 7, 2016, Treadwell et al.
U.S. Appl. No. 62/106,407: filed Jan. 22, 2015, in the names of Joseph Yudovsky et al., & entitled "Injector for Spatially Separated Atomic Layer Deposition Chamber" pp. 1-68. (Year: 2015).

\* cited by examiner

SYSTEMS AND METHODS FOR ULTRAHIGH SELECTIVE NITRIDE ETCH

CROSS-REFERENCE TO RELATED APPLICATIONS

This application claims the benefit of U.S. Provisional Application No. 62/241,827, filed on Oct. 15, 2015. The entire disclosure of the application referenced above is incorporated herein by reference.

FIELD

The present disclosure relates to substrate processing systems, and more particularly to systems and methods for selectively etching silicon nitride.

BACKGROUND

The background description provided here is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Substrate processing systems may be used to etch film on a substrate such as a semiconductor wafer. The substrate processing systems typically include a processing chamber, a gas distribution device and a substrate support. During processing, the substrate is arranged on the substrate support. Different gas mixtures may be introduced into the processing chamber and radio frequency (RF) plasma may be used to activate chemical reactions.

Referring now to FIG. 1, when integrating some semiconductor substrates such as vertical NAND devices, silicon nitride needs to be etched with very high selectivity to other exposed materials. Hot phosphoric acid is the main chemistry that is used for etching silicon nitride film in these devices. This etch process has several limitations that need to be addressed including the ability to scale above 36 layers, reducing defects and pitting, and improving control of the etch rate. For example in FIG. 1, a single defect particle 10 may cause loss of a write line string in a memory device 14.

SUMMARY

A method for selectively etching a silicon nitride layer on a substrate includes arranging a substrate on a substrate support of a substrate processing chamber. The substrate processing chamber includes an upper chamber region, an inductive coil arranged outside of the upper chamber region, a lower chamber region including the substrate support and a gas dispersion device arranged between the upper chamber region and the lower chamber region. The gas dispersion device includes a plurality of holes in fluid communication with the upper chamber region and the lower chamber region. The method includes supplying an etch gas mixture to the upper chamber region and striking inductively coupled plasma in the upper chamber region by supplying power to the inductive coil. The method includes selecting the etch gas mixture to etch silicon nitride, promote silicon dioxide passivation and promote polysilicon passivation. The method includes selectively etching the silicon nitride layer on the substrate and extinguishing the inductively coupled plasma after a predetermined period.

In other features, the etch gas mixture includes a silicon nitride etch promoter including at least one gas selected from a group consisting of nitrogen trifluoride ($NF_3$), difluoromethane ($CH_2F_2$), tetrafluoro ethane ($CF_4$), and fluoromethane ($CH_3F$).

In other features, the silicon nitride etch promoter includes at least one gas selected from a group consisting of molecular oxygen ($O_2$), molecular nitrogen ($N_2$), and nitrous oxide ($N_2O$).

In other features, the etch gas mixture includes a silicon dioxide passivation promoter including at least one gas selected from a group consisting of fluoromethane ($CH_3F$) and difluoromethane ($CH_2F_2$).

In other features, the silicon dioxide passivation promoter further includes at least one gas selected from a group consisting of molecular oxygen ($O_2$), molecular nitrogen ($N_2$), and nitrous oxide ($N_2O$).

In other features, the etch gas mixture includes a polysilicon passivation promoter including at least one gas selected from a group consisting of molecular oxygen ($O_2$), molecular nitrogen ($N_2$), and nitrous oxide ($N_2O$).

In other features, the method includes, after the selectively etching, dry cleaning the substrate by supplying a dry clean gas mixture to the substrate processing chamber and striking plasma in the substrate processing chamber for a predetermined period.

In other features, the method includes repeating the etching using the etch gas mixture and the dry cleaning using the dry clean gas mixture one or more times.

In other features, the dry clean gas mixture includes at least one gas selected from a group consisting of carbon dioxide ($CO_2$) and carbon monoxide (CO). The dry clean gas mixture further includes a gas such as argon (Ar), Helium (He), Neon (Ne), and/or other rare or Noble gases. The dry clean gas mixture includes at least one gas selected from a group consisting of molecular nitrogen ($N_2$) or nitrous oxide ($N_2O$).

In other features, pressure in the substrate processing chamber is in a pressure range from 0.5 to 5 Torr.

In other features, a radio frequency (RF) bias is supplied to the substrate support during the etching. A radio frequency (RF) bias is not supplied to the substrate support during the etching.

In other features, the gas dispersion device includes a showerhead including a plurality of holes. The plurality of holes has a diameter in a range from 0.1" to 0.75".

In other features, the method includes grounding the gas dispersion device during the etching.

In other features, the etch gas mixture includes nitrogen trifluoride (NF3), difluoromethane (CH2F2), molecular oxygen (O2), molecular nitrogen (N2), nitrous oxide (N2O) and carbon dioxide ($CO_2$).

In other features, the etch gas mixture includes tetrafluoromethane (CF4), and fluoromethane (CH3F), molecular oxygen (O2), molecular nitrogen (N2), nitrous oxide (N2O) and carbon dioxide ($CO_2$).

In other features, the silicon nitride layer on the substrate is etched selectively relative to silicon dioxide. The silicon nitride layer on the substrate is etched selectively relative to polysilicon. The silicon nitride layer on the substrate is etched selectively relative to silicon oxycarbide (SiOC). The silicon nitride layer on the substrate is etched selectively relative to hafnium oxide (HfOx).

In other features, the silicon nitride layer on the substrate is etched selectively relative to titanium nitride (TiN). The silicon nitride layer on the substrate is etched selectively relative to tantalum nitride (TaN). The silicon nitride layer on the substrate is etched selectively relative to tungsten (W). The silicon nitride layer on the substrate is etched selectively relative to titanium aluminum nitride (TiAlN).

Further areas of applicability of the present disclosure will become apparent from the detailed description, the claims and the drawings. The detailed description and specific examples are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

In the drawings, reference numbers may be reused to identify similar and/or identical elements.

DETAILED DESCRIPTION

Systems and methods according to the present disclosure utilize a substrate processing system providing high-density, inductively-coupled plasma and optional secondary capacitively-coupled plasma. In some examples, the substrate processing system includes upper and lower chamber regions separated by a showerhead. Ions are generated in an upstream upper chamber region, filtered through the showerhead and recombined in a downstream lower chamber region. Particle density leads to high etch rates and molecular passivation of silicon dioxide and polysilicon enables high selectivity.

In some examples, an RF bias may be applied to the substrate support to generate secondary capacitively-coupled plasma for generating additional selective radicals. In some examples, high RF coupling efficiency provides high plasma density while low sheath voltage introduces minimum sputtering from walls of the upper chamber region and the showerhead and therefore minimum defects.

In some examples, the gas chemistry includes an etch gas mixture including process gases for promoting silicon nitride etch, passivating silicon dioxide and passivating polysilicon. In some examples, a dry clean plasma process is performed cyclically with the etch process or the dry clean process may be performed after the etching process. The process selectively etches silicon nitride relative to silicon dioxide and polysilicon. In addition, the process selectively etches silicon nitride relative to other materials such as interlayer dielectrics, low k dielectrics, oxides, flowable oxides, doped oxides, silicon oxycarbide (SiOC), hafnium oxide ($HfO_x$) where x is an integer greater than one, titanium nitride (TiN), tantalum nitride (TaN), tungsten (W) and titanium aluminum nitride (TiAlN).

Figure 1:
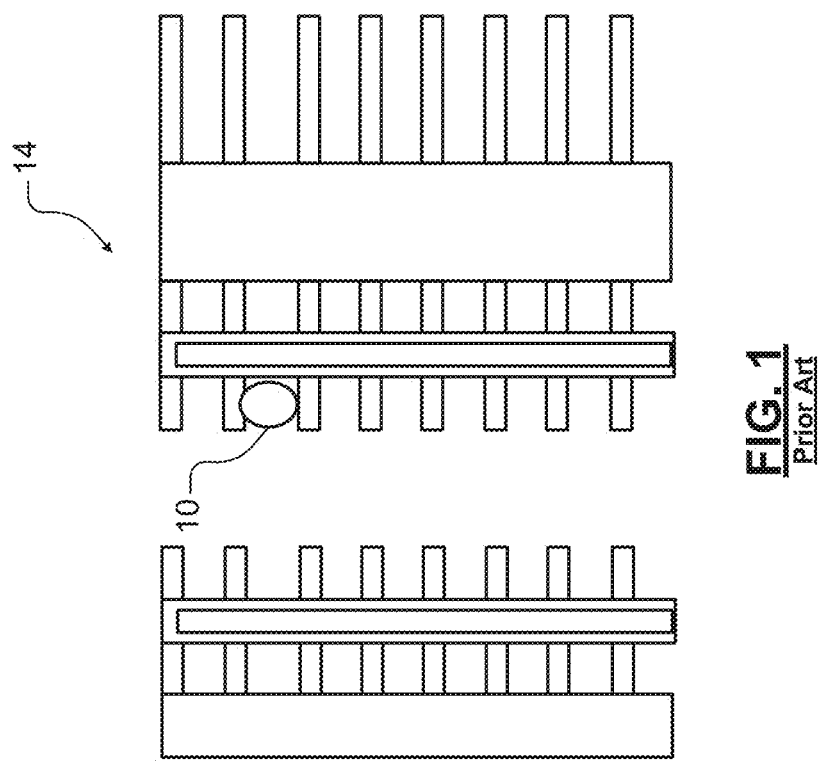
FIG. 1 is a plan view illustrating a memory device having a defect particle shorting two write lines of a memory device according to the prior art.
Figure 2:
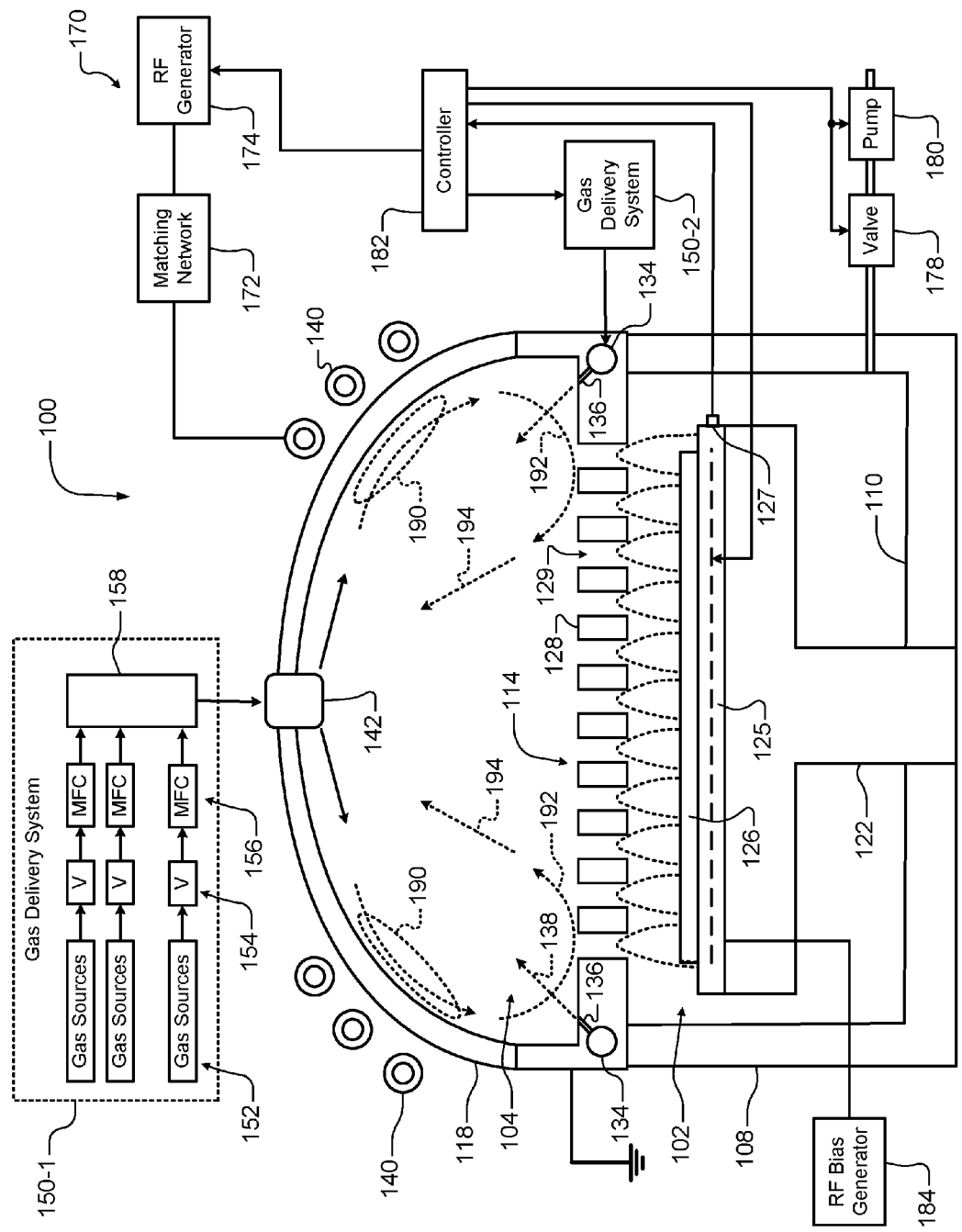
FIG. 2 is a functional block diagram of an example of a substrate processing chamber for selectively etching silicon nitride and performing plasma dry cleaning according to the present disclosure.

Referring now to FIG. 2, an example of a substrate processing chamber 100 is shown for selectively etching silicon nitride on a substrate and dry cleaning the substrate. The substrate processing chamber 100 includes a lower chamber region 102 and an upper chamber region 104. The lower chamber region 102 is defined by chamber sidewall surfaces 108, a chamber bottom surface 110 and a lower surface of a gas distribution device 114. The upper chamber region 104 is defined by an upper surface of the gas distribution device 114 and an inner surface of a dome 118. In some examples, the dome 118 is spherical, although a cylindrical upper chamber region with a flat top and flat inductive coil(s) can also be used.

A substrate support 122 is arranged in the lower chamber region 104. In some examples, the substrate support 122 includes an electrostatic chuck (ESC), although other types of substrate supports can be used. A substrate 126 is arranged on an upper surface of the substrate support 122 during the etching and dry cleaning process. In some examples, a temperature of the substrate 126 may be controlled by a heater plate 125, an optional cooling plate with flow channels (not shown) and/or one or more sensors 127, although any other suitable substrate heaters may be used.

In some examples, the gas distribution device 114 includes a showerhead (for example, a plate 128 having a plurality of spaced holes 129). The plurality of spaced holes 129 extend from the upper surface of the plate 128 to the lower surface of the plate 128. In some examples, the plurality of holes has a diameter from 0.1" to 0.75", although other sizes may be used. In some examples, the plate 128 is made of a conducting material such as aluminum. In other examples, the plate 128 is made of a non-conducting material such as ceramic and includes an embedded electrode.

In some examples, radially outer ends of the gas distribution device 114 may extend upwardly and may define a gas flow channel 134. The gas flow channel 134 is in fluid communication with a plurality of holes 136 for directing gas from the gas flow channel 134 into the upper chamber region 104. In some examples, the plurality of holes 136 direct gas flow from the gas flow channel 134 at an acute radially-inward angle relative to the upper surface of the plate 128 as shown by reference number 138.

An inductive coil 140 is arranged around an outer portion of the dome 118. When energized, the inductive coil 140 creates an electromagnetic field inside of the dome 118. A gas diffuser 142 disburses feed gas or a feed gas mixture from a gas delivery system 150-1. In some examples, the gases may be directed into the upper chamber region using the diffuser 142 and/or the plurality of holes 136.

In some examples, the gas delivery system 150-1 includes one or more gas sources 152, one or more valves 154, one or more mass flow controllers (MFCs) 156, and a mixing manifold 158, although other types of gas delivery systems may be used. Another gas delivery system 150-2 may be used to supply a feed gas or a feed gas mixture to the gas flow channel 134 (in addition to or instead of feed gas from the gas diffuser 142).

A plasma generator 170 may be used to generate RF power that is output to the inductive coil 140. Plasma is generated in the upper chamber region 104. In some examples, the plasma generator 170 includes an RF source 172 and a matching network 174. The matching network 174 matches an impedance of the RF source 172 to the impedance of the inductive coil 140. In some examples, the gas distribution device 114 is grounded. A valve 178 and a pump 180 may be used to control pressure inside of the lower and upper chamber regions 102, 104 and to evacuate reactants from the lower and upper chamber regions 102, 104, respectively.

A controller 176 communicates with the gas delivery systems 150-1 and 150-2, the valve 178, the pump 180, the heater plate 125, and/or the plasma generator 170 to control flow of process gas, purge gas, RF plasma and chamber pressure. Plasma zones 190 are created in the upper chamber region 104. References numbers 190, 192 and 194 illustrate flow of process gases from the gas diffuser 142.

In some examples, plasma is sustained inside the dome 118 by the inductive coil, which is located on an atmospheric side of the dome 118. Feed gas is introduced from the top of the chamber using the gas diffuser 142 and/or the holes 136 and plasma is confined within the dome 118 using the gas distribution device 114, which is grounded. Cold plasma diffuses through the gas distribution device 114 and reacts with the substrate 126 located in the lower chamber region 102.

Confining the plasma in the dome 118 allows volume recombination of plasma species and effusing desired etchant species through the gas distribution device 114. In some examples, there is no bias applied to the substrate 126. As a result, there is no active sheath on the substrate 126 and ions are not hitting the substrate with any finite energy. Some amount of the ions will diffuse out of the plasma region through the gas distribution device 114. However, the amount of plasma that diffuses is an order of magnitude lower than the plasma located inside the dome 118. Most of the ions in the plasma are lost by volume recombination at high pressures. Surface recombination loss at the upper surface of the gas distribution device 114 also lowers ion density below the gas distribution device 114.

In other examples, an RF bias is supplied to the substrate support. An RF bias generator 184 selectively provides an RF bias to the substrate support. A matching network (not shown) may be used between the RF bias generator 184 and the substrate support.

The RF power applied to the inductive coil and the RF bias may have the same or different frequencies or power levels. In some examples, both the RF power applied to the inductive coil and the RF bias are at 13.56 MHz, although other frequencies may be used. For example only, the RF bias may be supplied at a frequency such as 2 MHz, 27 MHz or another frequency while the RF applied to the inductive coil is supplied at a frequency of 13.56 MHz. In some examples, the RF power applied to the inductive coil may be in a range from 1 kW to 5 kW. In other examples, the RF power applied to the inductive coil may be in a range from 1 kW to 2.5 kW. In some examples, the RF bias power may be supplied at a range from 100 W to 1 kW, although other power levels may be used. In some examples, pressure in the processing chamber is in a range from 0.3 Torr to 10 Torr. In other examples, pressure in the processing chamber is in a range from 0.5 Torr to 5 Torr. In some examples, the substrate is maintained at a temperature from 0° C. to 120° C.

Figure 3A:
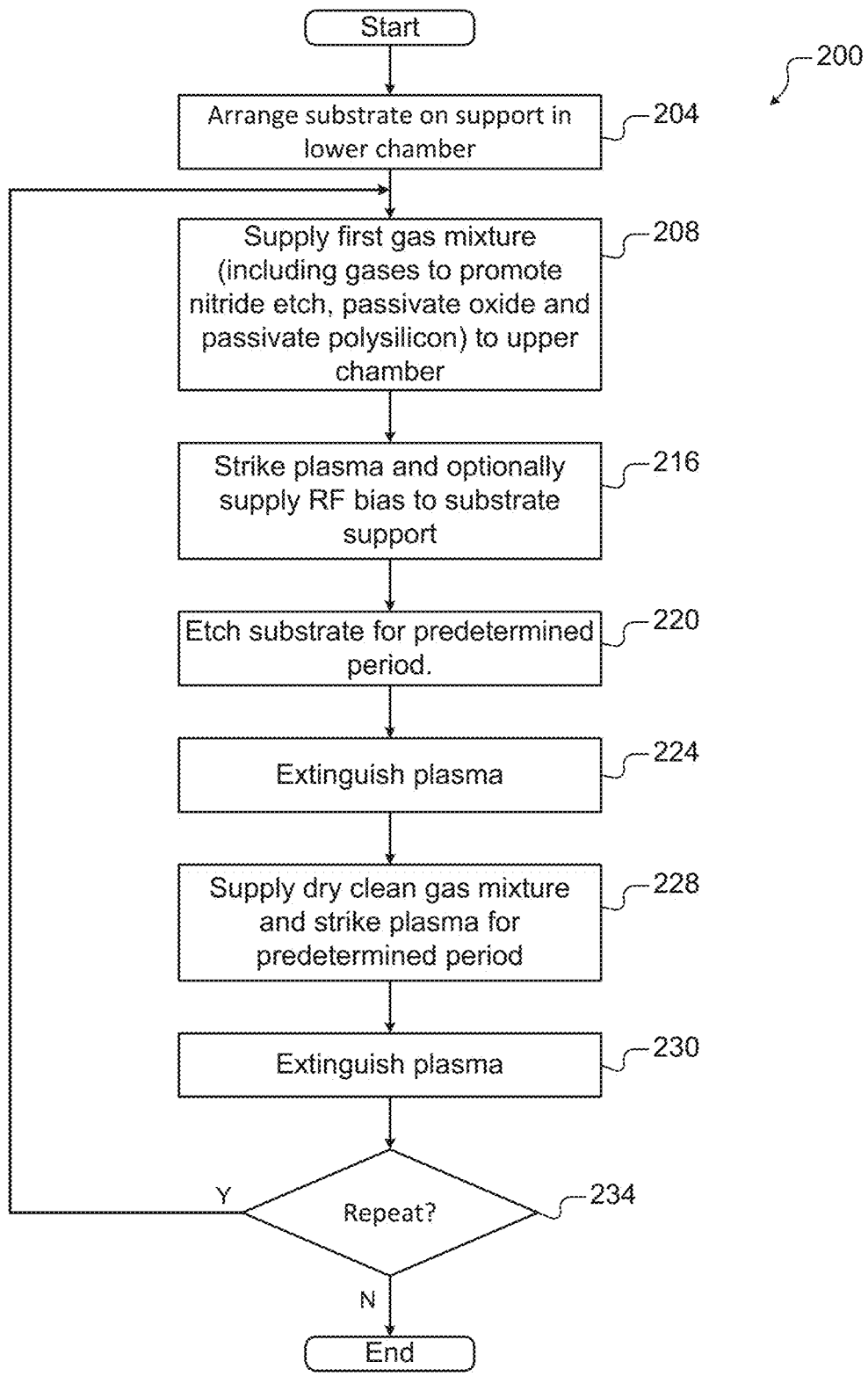
FIGS. 3A-3B are flowcharts illustrating examples of methods for selectively etching silicon nitride and performing plasma dry cleaning according to the present disclosure.

Referring now to FIG. 3A, a method 200 for selectively etching silicon nitride is shown. At 204, a substrate is arranged on a substrate support in the lower chamber region. At 208, an etch gas mixture is supplied to the upper chamber region. The etch gas mixture includes one or more gases for promoting silicon nitride etch, passivating polysilicon and passivating silicon dioxide. At 216, plasma is struck in the upper chamber region. In addition, an RF bias may optionally be supplied to the substrate support in the lower chamber region. At 220, the substrate is etched for predetermined period. At 224, the plasma is extinguished after the predetermined period. At 228, a dry clean gas mixture may optionally be supplied to the upper chamber region and plasma may be struck for a predetermined period. The RF bias to the substrate support may be provided during the dry clean process. At 230, the plasma is extinguished after a predetermined period. At 234, the process of etching and dry cleaning may be repeated one or more times in a cyclic manner.

Figure 3B:
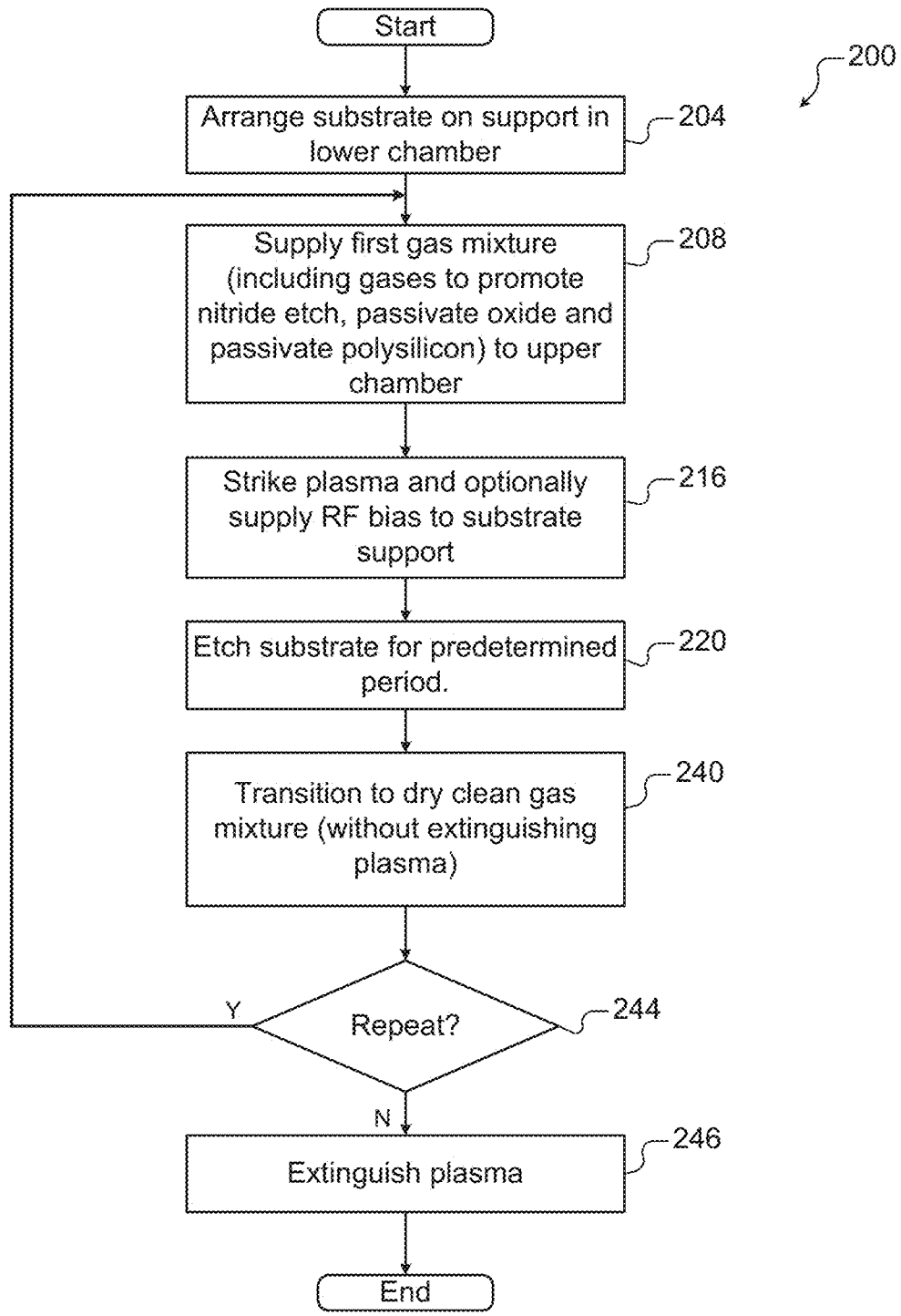

Referring now to FIG. 3B, an alternative process transitions from the silicon nitride etching to the plasma dry cleaning without extinguishing the plasma. At 240, the chemistry is transitioned to a dry clean gas mixture without extinguishing the plasma. The dry clean process proceeds for a predetermined period. The RF bias to the substrate support may be provided during the dry clean process. At 242, the process of etching and dry cleaning may be repeated one or more times in a cyclic manner without extinguishing the plasma. At 244, the plasma is extinguished. Alternately, the plasma may be extinguished when returning to etching and then struck again for etching.

In some examples, gases for promoting nitride etch include nitrogen trifluoride ($NF_3$), difluoromethane ($CH_2F_2$), tetrafluoro ethane ($CF_4$), fluoromethane ($CH_3F$), a combination of molecular oxygen, molecular nitrogen, and nitrous oxide ($O_2/N_2/N_2O$), and combinations thereof. In some examples, gases for promoting silicon dioxide passivation include $CH_3F$, $CH_2F_2$, and/or $O_2/N_2/N_2O$. In some examples, gases for promoting polysilicon passivation include $O_2/N_2/N_2O$, $N_2O$, or $O_2/N_2$. In some examples, dry clean gases include carbon dioxide $CO_2$, carbon dioxide and argon ($CO_2/Ar$), carbon monoxide (CO), carbon monoxide and argon (CO/Ar) or combinations of the preceding gases, $N_2$, or $N_2O$. In some examples, plasma stabilization and dilutive gases may be provided such as argon (Ar).

In some examples, the etch gas mixture includes a nitride etch gas, a polysilicon passivation promoting gas and a silicon dioxide passivation promoting gas. In some examples, the nitride etch gas includes at least one gas selected from a group consisting of $NF_3$, $CH_2F_2$, $CF_4$ and $CH_3F$ and optionally $O_2/N_2/N_2O$.

In a first example, the etch gas mixture includes $NF_3/CH_2F_2/O_2/N_2/N_2O/CO_2$. Examples of flow rates are set forth below in Table 1. In this example, $NF_3$ promotes nitride etch. $CH_2F_2$ promotes nitride etch and passivates silicon dioxide, $O_2/N_2/N_2O$ promotes nitride etch and promotes polysilicon and silicon dioxide passivation. A dry clean step is performed after the etching process and/or the etching and dry cleaning processes may be performed cyclically.

In a second example, the etch gas mixture includes $CF_4/CH_3F/O_2/N_2/N_2O/CO_2$. In this example, $CF_4$ promotes nitride etch. Examples of flow rates are set forth below in Table 1. $CH_3F$ promotes nitride etch and promotes silicon dioxide passivation. $O_2/N_2/N_2O$ promotes nitride etch and promotes polysilicon and silicon dioxide passivation. A plasma dry clean step is performed after the etching process and/or the etching and dry cleaning processes may be performed cyclically.

Figure 4:
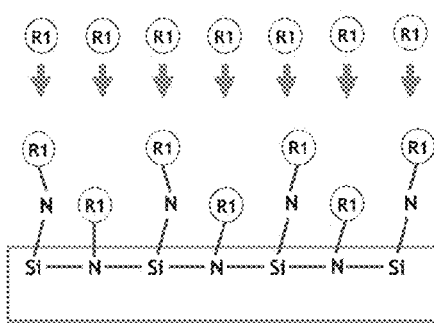
FIG. 4 illustrates selective etching of silicon nitride and passivation of silicon dioxide and polysilicon.
Figure 5:
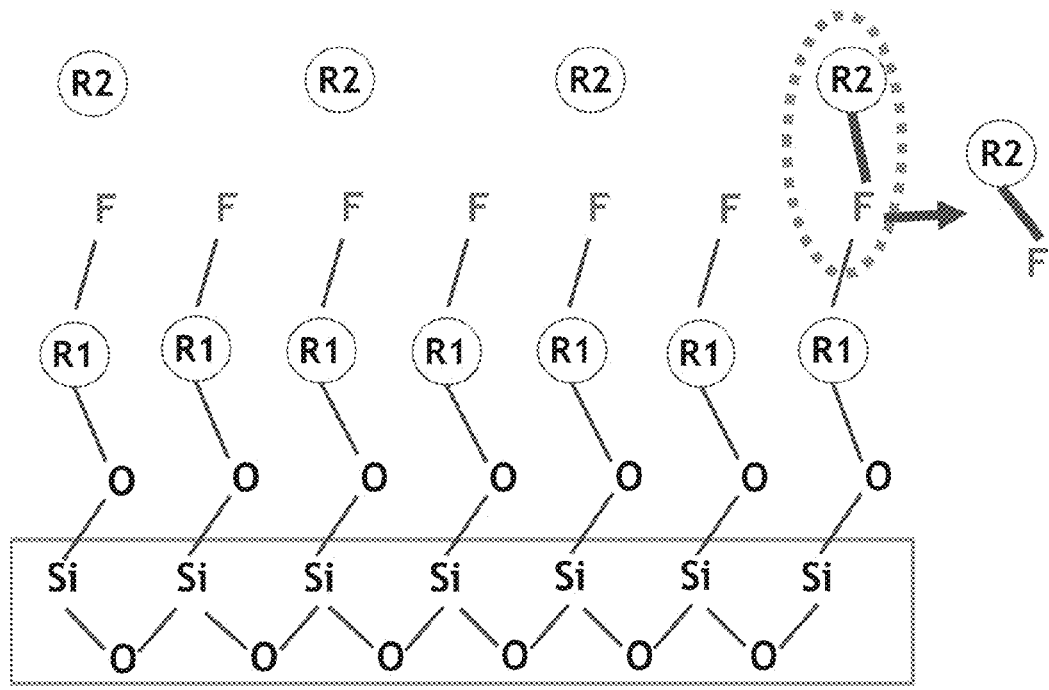
FIG. 5 illustrates a plasma dry clean process according to the present disclosure.

Referring now to FIGS. 4-5, a dry plasma removal process avoids pattern collapsing and provides improved control of top and bottom recess amounts. The systems and methods described herein provide a unique process to passivate surfaces other than nitride with the radical R1. The dry clean or cyclic process removes passivation agents after the etch process or between main etch steps. The inductively coupled plasma source operating at high pressure generates high density of molecular-form radicals R1 in metastable states. The process has increased chemical selectivity for surface passivation as compared to polymer chemistries. Surface passivation can be cleaned up with other radicals such as radical R2.

In FIG. 4, radicals from downstream plasma are chemisorbed by nitride. The desorption rate is high on the silicon nitride. During fluoridation, the silicon nitride is removed by F reactions. Radicals from the downstream plasma are chemisorbed by oxide in the silicon dioxide. The desorption rate is controlled to a very low rate on the oxide. During fluoridation, silicon dioxide is protected from fluorine attack by molecular passivation. In FIG. 5, radicals provided by the dry clean gas remove excess fluorine after etching or between etch steps.

Figure 6:
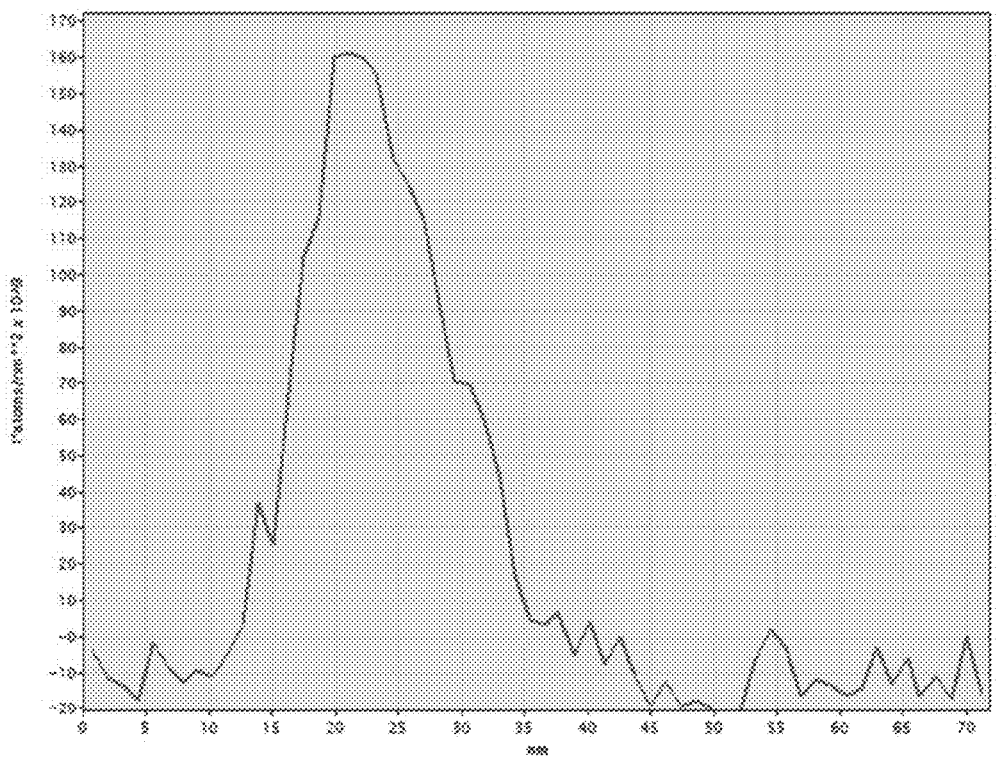
FIG. 6 is a graph illustrating fluorine concentration after silicon nitride etching according to the present disclosure without plasma dry clean.
Figure 7:
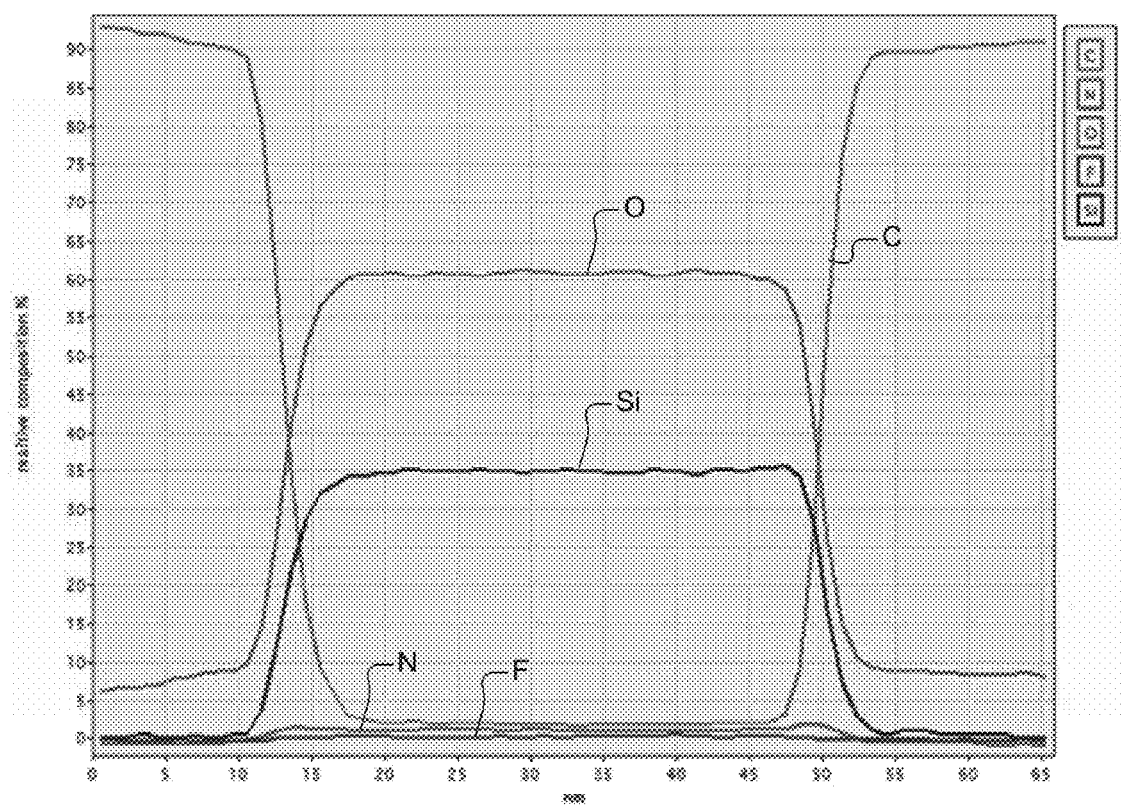
FIG. 7 is a graph illustrating carbon, nitrogen, oxygen, fluorine and silicon concentrations after using the selective etching process and plasma dry cleaning according to the present disclosure.

Referring now to FIGS. 6-7, fluorine levels are monitored for the silicon nitride etch without and with the dry clean process described above, respectively. In FIG. 6, a graph illustrates fluorine concentration after the silicon nitride etching without the dry clean process. In FIG. 7, a graph illustrating carbon, nitrogen, oxygen, fluorine and silicon concentrations after using the selective etching and dry clean processes according to the present disclosure are shown.

The selective silicon nitride etch described herein provides high selectivity to polysilicon and silicon dioxide. In some examples, there is no polysilicon loss at bottoms of features and the etch rate is greater than 1000:1. In addition, no pitting was observed. In addition, silicon dioxide selectivity demonstrates less than 1 Å of silicon dioxide thin loss which is greater than 1000:1 selectivity. The fins are sharp and residue free. The selective silicon nitride etch described herein reduces fluorine exposure time by increasing the etch rate. The process uses the radical R2 to eliminate fluorine between, during or after the process. In addition, the process selectively etches silicon nitride relative to other materials such as silicon oxycarbide (SiOC), hafnium oxide ($HfO_x$) where x is an integer greater than one, titanium nitride (TiN), tantalum nitride (TaN), tungsten (W) and titanium aluminum nitride (TiAlN).

In the following Table 1, typical flow rates for various gases are shown. However, other flow rates may be used.

TABLE 1

| Gas | Typical Flow (sccm) | Range (sccm) |
|---|---|---|
| $NF_3$ | 100 | 0-500 |
| $CH_2F_2$ | 100 | 0-500 |
| $O_2$ | 3000 | 1000-5000 |
| $N_2$ | 3000 | 1000-5000 |
| $N_2O$ | 4700 | 1000-8000 |
| $CO_2$ | 100 (ME) | 0-500 |
|  | 2000 (dry clean) | 1000-5000 |
| $CF_4$ | 100 | 0-500 |
| $CH_3F$ | 100 | 0-500 |
| CO | 2000 (dry clean) | 1000-5000 |
| Ar | 2000 | 1000-5000 |
| He | 2000 | 1000-5000 |

The foregoing description is merely illustrative in nature and is in no way intended to limit the disclosure, its application, or uses. The broad teachings of the disclosure can be implemented in a variety of forms. Therefore, while this disclosure includes particular examples, the true scope of the disclosure should not be so limited since other modifications will become apparent upon a study of the drawings, the specification, and the following claims. It should be understood that one or more steps within a method may be executed in different order (or concurrently) without altering the principles of the present disclosure. Further, although each of the embodiments is described above as having certain features, any one or more of those features described with respect to any embodiment of the disclosure can be implemented in and/or combined with features of any of the other embodiments, even if that combination is not explicitly described. In other words, the described embodiments are not mutually exclusive, and permutations of one or more embodiments with one another remain within the scope of this disclosure.

Spatial and functional relationships between elements (for example, between modules, circuit elements, semiconductor layers, etc.) are described using various terms, including "connected," "engaged," "coupled," "adjacent," "next to," "on top of," "above," "below," and "disposed." Unless explicitly described as being "direct," when a relationship between first and second elements is described in the above disclosure, that relationship can be a direct relationship where no other intervening elements are present between the first and second elements, but can also be an indirect relationship where one or more intervening elements are present (either spatially or functionally) between the first and second elements. As used herein, the phrase at least one of A, B, and C should be construed to mean a logical (A OR B OR C), using a non-exclusive logical OR, and should not be construed to mean "at least one of A, at least one of B, and at least one of C."

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with the system, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. A method for selectively etching a silicon nitride layer on a substrate, comprising:
arranging the substrate on a substrate support of a substrate processing chamber,
wherein the substrate processing chamber includes an upper chamber region, an inductive coil arranged outside of the upper chamber region, a lower chamber region including the substrate support and a gas dispersion device arranged between the upper chamber region and the lower chamber region, and
wherein the gas dispersion device includes a plurality of holes in fluid communication with the upper chamber region and the lower chamber region;
supplying an etch gas mixture to the upper chamber region;
striking inductively coupled plasma in the upper chamber region by supplying power to the inductive coil, wherein the etch gas mixture etches silicon nitride, promotes silicon dioxide passivation and promotes polysilicon passivation;
selectively etching the silicon nitride layer on the substrate;
extinguishing the inductively coupled plasma after a predetermined period; and
after the selectively etching, dry cleaning the substrate by supplying a dry clean gas mixture to the substrate processing chamber and striking plasma in the substrate processing chamber for another predetermined period.

2. The method of claim 1, wherein the etch gas mixture includes a silicon nitride etch promoter including at least one gas selected from a group consisting of nitrogen trifluoride ($NF_3$), difluoromethane ($CH_2F_2$), tetrafluoromethane ($CF_4$), and fluoromethane ($CH_3F$).

3. The method of claim 2, wherein the silicon nitride etch promoter includes at least one gas selected from a group consisting of molecular oxygen ($O_2$), molecular nitrogen ($N_2$), and nitrous oxide ($N_2O$).

4. The method of claim 1, wherein the etch gas mixture includes a silicon dioxide passivation promoter including at least one gas selected from a group consisting of fluoromethane ($CH_3F$) and difluoromethane ($CH_2F_2$).

5. The method of claim 4, wherein the silicon dioxide passivation promoter further includes at least one gas selected from a group consisting of molecular oxygen ($O_2$), molecular nitrogen ($N_2$), and nitrous oxide ($N_2O$).

6. The method of claim 1, wherein the etch gas mixture includes a polysilicon passivation promoter including at least one gas selected from a group consisting of molecular oxygen ($O_2$), molecular nitrogen ($N_2$), and nitrous oxide ($N_2O$).

7. The method of claim 1, further comprising repeating the etching using the etch gas mixture and the dry cleaning using the dry clean gas mixture one or more times.

8. The method of claim 7, wherein the dry clean gas mixture includes at least one gas selected from a group consisting of carbon dioxide ($CO_2$) and carbon monoxide (CO).

9. The method of claim 8, wherein the dry clean gas mixture further includes at least one gas selected from a group including argon (Ar), Neon (Ne) and Helium (He).

10. The method of claim 1, wherein the dry clean gas mixture includes at least one gas selected from a group consisting of molecular nitrogen ($N_2$) or nitrous oxide ($N_2O$).

11. The method of claim 1, wherein pressure in the substrate processing chamber is in a pressure range from 0.5 to 5 Torr.

12. The method of claim 1, wherein a radio frequency (RF) bias is supplied to the substrate support during the etching.

13. The method of claim 1, wherein a radio frequency (RF) bias is not supplied to the substrate support during the etching.

14. The method of claim 1, wherein the gas dispersion device includes a showerhead including a plurality of holes.

15. The method of claim 14, wherein the plurality of holes have diameters in a range from 0.1" to 0.75".

16. The method of claim 1, further comprising grounding the gas dispersion device during the etching.

17. The method of claim 1, wherein the etch gas mixture includes nitrogen trifluoride ($NF_3$), difluoromethane ($CH_2F_2$), molecular oxygen ($O_2$), molecular nitrogen ($N_2$), nitrous oxide ($N_2O$) and carbon dioxide ($CO_2$).

18. The method of claim 1, wherein the etch gas mixture includes tetrafluoromethane ($CF_4$), and fluoromethane ($CH_3F$), molecular oxygen ($O_2$), molecular nitrogen ($N_2$), nitrous oxide ($N_2O$) and carbon dioxide ($CO_2$).

19. The method of claim 1, wherein the silicon nitride layer on the substrate is etched selectively relative to silicon dioxide.

20. The method of claim 1, wherein the silicon nitride layer on the substrate is etched selectively relative to polysilicon.

21. The method of claim 1, wherein the silicon nitride layer on the substrate is etched selectively relative to silicon oxycarbide (SiOC).

22. The method of claim 1, wherein the silicon nitride layer on the substrate is etched selectively relative to hafnium oxide ($HfO_x$).

23. The method of claim 1, wherein the silicon nitride layer on the substrate is etched selectively relative to titanium nitride (TiN).

24. The method of claim 1, wherein the silicon nitride layer on the substrate is etched selectively relative to tantalum nitride (TaN).

25. The method of claim 1, wherein the silicon nitride layer on the substrate is etched selectively relative to tungsten (W).

26. The method of claim 1, wherein the silicon nitride layer on the substrate is etched selectively relative to titanium aluminum nitride (TiAlN).

27. A method for selectively etching a silicon nitride layer on a substrate, comprising:
   arranging the substrate on a substrate support of a substrate processing chamber,
   wherein the substrate processing chamber includes an upper chamber region, an inductive coil arranged outside of the upper chamber region, a lower chamber region including the substrate support and a gas dispersion device arranged between the upper chamber region and the lower chamber region, and
   wherein the gas dispersion device includes a plurality of holes in fluid communication with the upper chamber region and the lower chamber region;
   supplying an etch gas mixture to the upper chamber region;
   striking inductively coupled plasma in the upper chamber region by supplying power to the inductive coil, wherein the etch gas mixture etches silicon nitride, promotes silicon dioxide passivation and promotes polysilicon passivation;
   selectively etching the silicon nitride layer on the substrate; and
   extinguishing the inductively coupled plasma after a predetermined period,
   wherein the etch gas mixture includes nitrogen trifluoride ($NF_3$), difluoromethane ($CH_2F_2$), molecular oxygen ($O_2$), molecular nitrogen ($N_2$), nitrous oxide ($N_2O$) and carbon dioxide ($CO_2$); or
   wherein the etch gas mixture includes tetrafluoromethane ($CF_4$), fluoromethane ($CH_3F$), molecular oxygen ($O_2$), molecular nitrogen ($N_2$), nitrous oxide ($N_2O$) and carbon dioxide ($CO_2$).

28. A method for selectively etching a silicon nitride layer on a substrate, comprising:
   arranging the substrate on a substrate support of a substrate processing chamber,
   wherein the substrate processing chamber includes an upper chamber region, an inductive coil arranged outside of the upper chamber region, a lower chamber region including the substrate support and a gas dispersion device arranged between the upper chamber region and the lower chamber region, and
   wherein the gas dispersion device includes a plurality of holes in fluid communication with the upper chamber region and the lower chamber region;
   supplying an etch gas mixture to the upper chamber region;
   striking inductively coupled plasma in the upper chamber region by supplying power to the inductive coil, wherein the etch gas mixture etches silicon nitride, promotes silicon dioxide passivation and promotes polysilicon passivation;
   selectively etching the silicon nitride layer on the substrate; and
   extinguishing the inductively coupled plasma after a predetermined period,
   wherein the silicon nitride layer on the substrate is etched selectively relative to silicon oxycarbide (SiOC), hafnium oxide ($HfO_x$), titanium nitride (TiN), tantalum nitride (TaN), or titanium aluminum nitride (TiAlN).

* * * * *